United States Patent
Holmberg et al.

(10) Patent No.: US 6,729,238 B2
(45) Date of Patent: May 4, 2004

(54) PRINTING OF A CONDUCTIVE COATING ON AN ELECTRIC UNIT

(75) Inventors: Per Holmberg, Dalby (SE); Lars Eriksson, Emmaboda (SE)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 108 days.

(21) Appl. No.: 09/805,408

(22) Filed: Mar. 13, 2001

(65) Prior Publication Data

US 2002/0026876 A1 Mar. 7, 2002

(30) Foreign Application Priority Data

Mar. 14, 2000 (SE) .............................. 0000862
Apr. 13, 2000 (SE) .............................. 0002177

(51) Int. Cl.$^7$ ................................ B41F 1/34
(52) U.S. Cl. .................. 101/485; 101/35; 101/170; 101/483
(58) Field of Search ................ 101/485, 484, 101/483, 35, 4, 170; 427/123, 256, 261, 282, 299, 429

(56) References Cited

U.S. PATENT DOCUMENTS

| | | | | |
|---|---|---|---|---|
| 2,748,696 A | * | 6/1956 | Murray et al. | 101/379 |
| 5,383,398 A | * | 1/1995 | Binnen | 101/151 |
| 5,802,972 A | * | 9/1998 | Hoffmann et al. | 101/163 |
| 6,158,341 A | * | 12/2000 | Holmberg | 101/170 |
| 6,200,630 B1 | * | 3/2001 | Eriksson | 156/292 |

FOREIGN PATENT DOCUMENTS

| | | |
|---|---|---|
| WO | 97/34459 | 9/1997 |
| WO | 99/15334 | 4/1999 |

\* cited by examiner

*Primary Examiner*—Minh H Chau
(74) *Attorney, Agent, or Firm*—Burns, Doane, Swecker & Mathis, L.L.P.

(57) ABSTRACT

A method for printing a conductive coating on an electronic unit by means of tampon printing is provided. During the tampon printing phase, a tampon pad is moved in small movements in one or more directions in relation to the electronic unit. The movements are made while the tampon pad is in contact with the surface to be printed.

14 Claims, 2 Drawing Sheets

PRINTING OF A CONDUCTIVE COATING ON AN ELECTRIC UNIT

BACKGROUND

The present invention concerns a way of printing, by means of tampon printing of a conductive coating on a detail, such as the casing of an electrical or electronic unit, such as a telephone.

When an electrical or electronic unit, such as a telephone is to be shielded against electromagnetic radiation, such as ESD currents, the unit is surrounded at least partly by a conductive material. The conductive material consists of a conductive layer or coating e.g. printed by means of tampon printing on the surface of the detail.

At tampon printing a picture is created on a detail by a method which starts in that paint is raked out by a so called cup, filled with paint, against a cliché. This is embossed with a certain depth and the paint will be trapped in the embossing and thus a picture is formed, which then will be fetched by the tampon pad. This is then moved and goes down towards the detail and is pressed against it. The tampon pad is soft and the picture will adhere to the detail.

Normally smooth surfaces are printed without any mayor problems when using tampon printing of the prior art. At corners, ribs, orifices, screw sockets, snaps, protruding parts, walls etc. it is hard to reach the surface and print the conductive coating when using a tampon pad. However it is known to rotate the detail or to alter the angle of attack of the tampon pad, in order to have a new printing direction. Hereby the tampon pad will more easily reach the surface and give a better print on the surface of the detail. This is often not enough to get a satisfactory result as the most difficult parts of the surface to reach will not be printed and there will be holes in the conductive coating. Furthermore, the coating will be too thin at some parts. If the above problems occur electromagnetic radiation will leak and the resistance of the coating increases and thereby will the conductivity decrease. Costly and time-consuming subsequent treatment will be needed, in form of an extra inlay of a conductive layer by means of spray painting using precision nozzles, tampon printing with extremely small tampon pads or many extra tampon prints from various angles of attack. These techniques are costly and defective.

When using other methods than tampon printing, such as spraying and vacuum evaporation of conductive coatings, insufficient results will often arise. This is due to the fact that grooves, corners, snaps, screw sockets etc. will create a shadowing effect leading to that parts of the surface to be spray painted or vacuum evaporated will not be coated. Thus, a completion of the surface must be made, in order to improve the shadowed parts, which also will be costly and time-consuming.

SUMMARY

One object of the present invention is to eliminate the drawbacks of the above methods by letting the tampon pad move in small movements in one or more directions in relation to an electronic unit, at the same time as the tampon pad is in contact with the surface to be printed.

Other objects and advantages of the present invention will be obvious for a person skilled in the art when reading the detailed description below.

The method of the invention is especially suitable for surfaces that are hard to reach such as at the corners of the casing, at screw sockets, at ribs or the like. This is due to the fact that the tampon pad is moved in different directions during the phase of tampon printing, and thus the pad will rub against the surface to be printed. Hereby the conductive layer will be better worked into the surface of the detail. Of course this method will get a better result for smooth surfaces than the present way of tampon printing.

BRIEF DESCRIPTION OF THE DRAWINGS

The invention will be more closely described below by means of preferred embodiments and with reference to the enclosed drawings. In the drawings.

DETAILED DESCRIPTION

Figure 1:
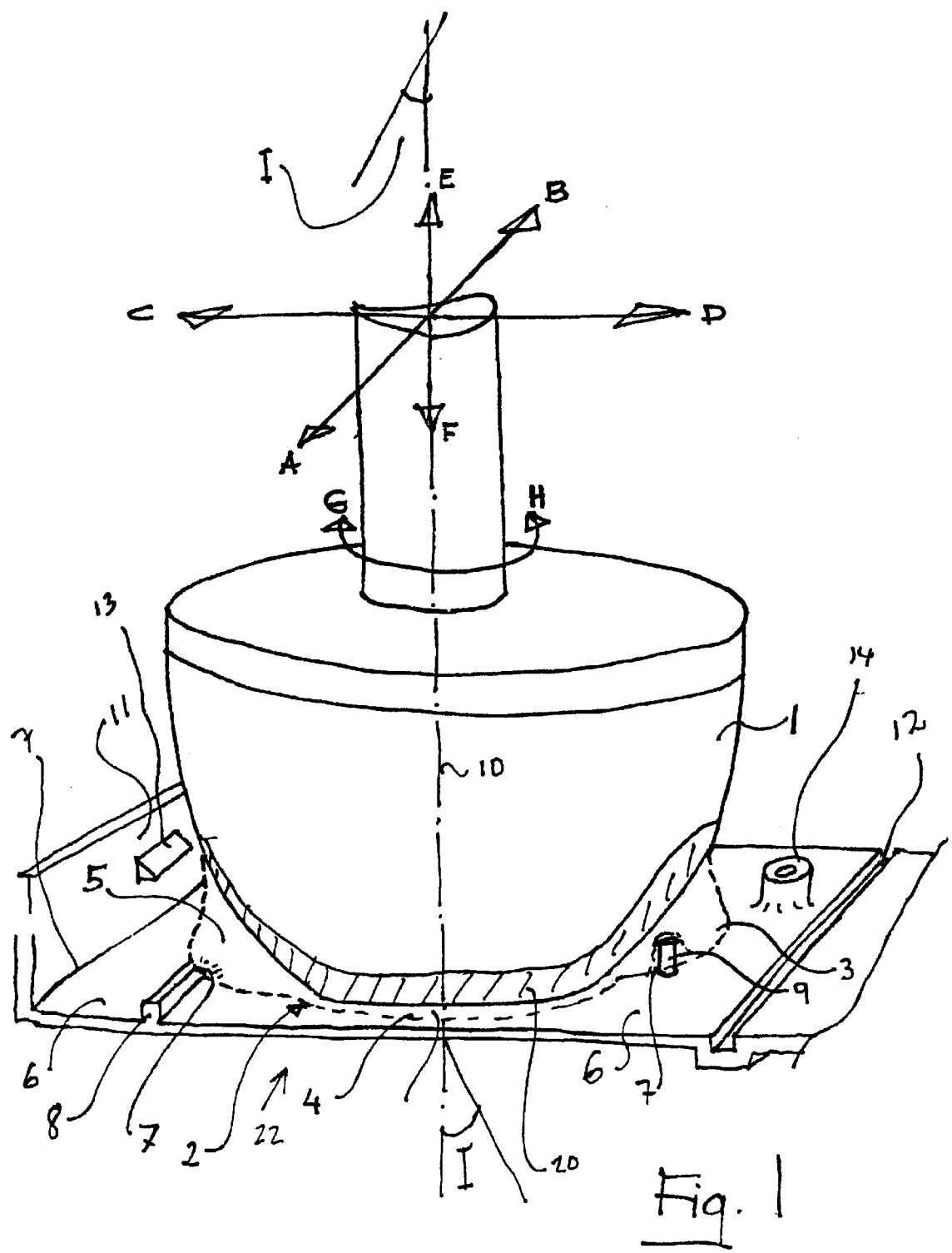
FIG. 1 is a perspective view of a tampon pad in the tampon print phase when a picture is tampon printed on a detail.

In the embodiment of FIG. 1, a detail 6 of an electronic unit 22 is shown. The detail 6 has locations such as a corner 7, a groove 8, a pin 9, a wall 11, a slot 12, a snap 13 or a screw socket 14 that are hard to reach in prior art printing. The detail 6 and a tampon pad 1 are moving in relation to each other during a tampon print phase. In tampon printing a picture 20 is fetched from a cliché. As used in this description the expression "picture" refers to a coating of conductive material.

According to the invention the tampon pad 1 and/or the detail 6 may move in any direction during a tampon print phase. The tampon print phase is started when the tampon pad 1 begins to touch the detail 6 and is ended when the tampon pad 1 completely has left the detail 6. During the tampon printing phase the tampon pad 1 moves in at least one direction at the same time as it is moving upwards or downwards, whereby it also may stop and then start moving again. According to the invention this movement may be in optional directions in three dimensions and furthermore the tampon pad 1 may turn around its axis during the tampon print phase. In this way a rubbing against the detail 6 will take place, whereby there will be a friction between the detail 6 and the tampon pad 1, which means that the tampon pad 1 will lag behind against the detail 6. As the tampon pad 1 is soft and yielding it will be deformed. The deformation will change the form of the tampon pad 1 in such a way that at least one swelling 2–5 is formed. The swelling 2–5 will be formed around irregularities, corners 7, walls 11, pins 9, slots 12, snaps 13, protrusions 18, holes etc. that normally are hard to reach. By means of the movements between the tampon pad 1 and the unit 22 and the softness of the tampon pad 1 the conductive coating will fill out all the spaces that are hard to reach.

In the tampon print phase the tampon pad 1 and/or the unit 22 may, according to the invention, move in any direction in a system of co-ordinates having three axes A, B; C,D; E,F. Furthermore, the tampon pad 1 and/or the unit 22 may rotate around an imaginary axis 10 in any rotation direction G, H. An angle of attack I may vary during the tampon print phase, whereby the detail 6 and/or the tampon pad 1 will change the direction of tampon print.

Figure 2:
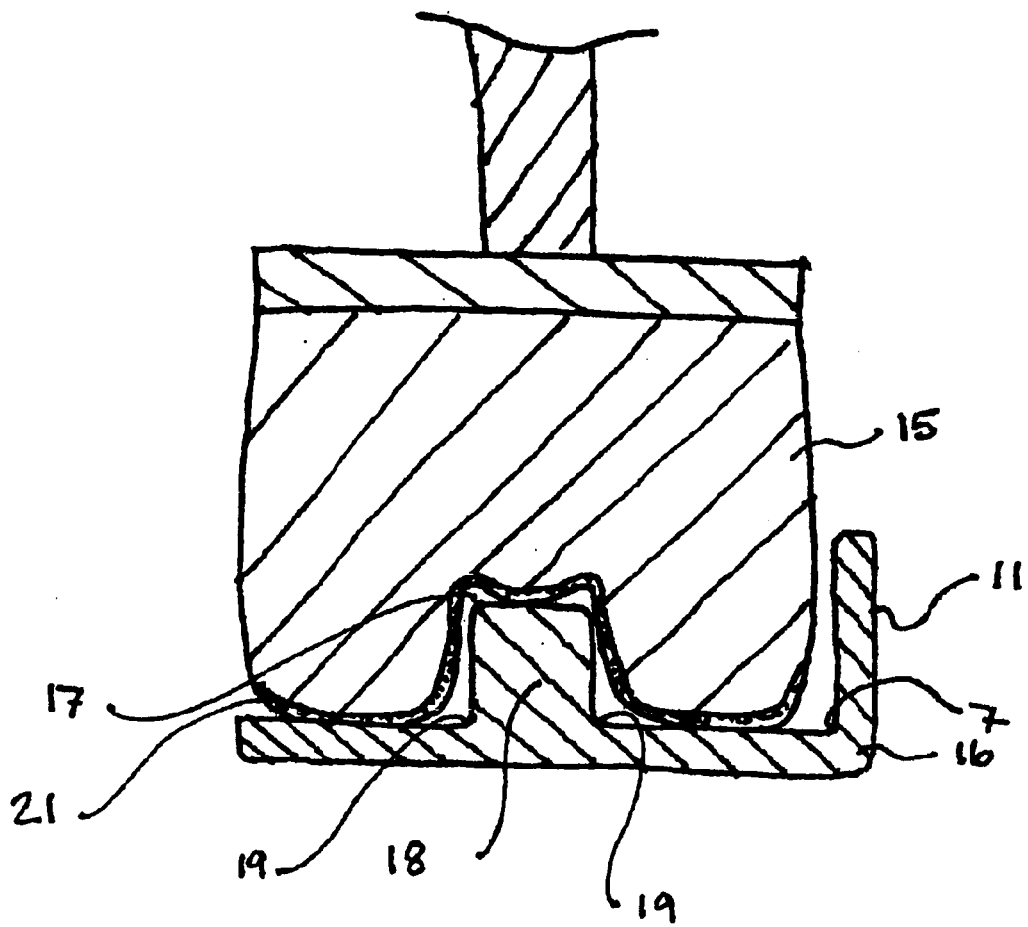
FIG. 2 is a section of a detail and a tampon pad having an adapted form.

As shown in the embodiment of FIG. 2 the tampon pad 15 may have a slot 17, which has a form adapted to a detail 16. The detail 16 has a protrusion 18 matching the slot 17 and a wall 11 matching the side of the tampon pad 15. During the tampon print phase the tampon pad 15 having the slot 17, is able to tampon print a picture 21 in all the intended locations on the surface of the detail 16.

By the invention a way to tampon print a conductive layer on a casing to an electronic or electrical unit 22 preferably a telephone is accomplished. By letting the tampon pad 1 make some extra movements, that could be compared to rubbing, a better coating of the conductive layer on the detail will be achieved. There will be a thicker coating at each tampon printing and a better adherence to the detail 6.

In a preferred embodiment of the invention a telephone casing is printed, comprising a bottom surface and walls 11, which form corners 7 against each other and a number of other locations that are hard to reach as stated above. The casing is placed with the bottom surface turned downwards and is fixed to a frame. In the tampon printing phase the tampon pad 1 and/or the frame will move with friction between the tampon pad 1 and the detail 6. First the pad 1 will move towards one of the walls 11. Hereby the friction against the bottom will substantially fix the bottom of the tampon pad 1 against the bottom surface of the detail 22 in such a way that the side of the tampon pad 1 will be able to print one of the walls 11 of the casing and the adjacent corners 7. Then the pad 1 will move in the opposite direction, whereby the opposite wall 11 and corners 7 of the casing will be printed. Thereafter the pad 1 will move first against the third wall 11 and then the last, fourth wall 11, whereby also all the corners 7 will be tampon printed. Furthermore all the other above locations that are hard to reach may be advanced by movements predetermined by a computer in a well adapted way, whereby also these will be tampon printed in the best way. At the printing of grooves 8, pins 9, slots 12, snaps 13 screw sockets 14 or the like the tampon pad 1,15 may go several times back and forth and rotate in relation to the unit 22. The computer will control the movements so that the detail including the locations that are hard to reach will be printed in an optimised order and way. Thus, it is possible that these locations are printed while the tampon pad is moving between the different walls 11.

According to the invention one or more movements up and down during the printing phase will also contribute to improve the possibility for the tampon pad 1 to reach. It is also possible to let the tampon pad 1 retard, stop and/or accelerate during at least one part of the tampon print phase. For instance it may be important with a very slow approach towards the detail 6. All of this plays an important roll for the possibility for the tampon pad 1 to be able to leave the picture on a detail 6 at locations 7,8,9,11,12,13,14,18 that are hard to reach.

Of course the tampon pad 15 of the invention may have an adapted form, matching the surface of the detail 6. A slot 17 in the tampon pad 15 may e.g. correspond to a protrusion 18, screw socket 14 or other locations of the detail 6 that are hard to reach as stated above. During the tampon print phase rubbing, together with the adapted form of the pad 15 improve the possibility to reach locations that are hard to reach.

It is of course possible to apply the invention also by performing the movements above mentioned in relation to the tampon print phase in the phase when the picture is fetched from the cliché, in order to better work it into the surface of the tampon pad 1,15. Hereby a bigger part and a more dispersed layer will adhere to the tampon pad 1,15.

Thus, the main advantage with the invention is an improved reach for the tampon pad 1. By the improved reach it is possible to tampon print the conductive layer at locations that are hard to reach, to decrease the number of tampon prints, to lower the costs and to increase the printing speed per printed detail. Furthermore, the thickness of the layer will increase with each tampon print. Also the layer will be better worked against the frame, which will improve the adherence.

What is claimed is:

1. A method for printing a conductive coating on an electronic unit by means of tampon printing, comprising the steps of:
   placing a portion of a tampon pad in contact with a surface of the electronic unit to be printed; and
   moving the tampon pad in small movements in at least one of a direction substantially parallel to the surface of the electronic unit, a rotational direction about a longitudinal axis of the tampon pad, and repeatedly in opposing directions along the longitudinal axis in relation to the electronic unit while at least the portion of the tampon pad is substantially in contact with the surface to be printed to create a friction between the portion of the tampon pad and the surface, wherein the friction causes the portion of the tampon pad to lag behind against the surface as the tampon pad is moving in small movements.

2. The method of claim 1, wherein the electronic unit is a mobile telephone.

3. The method of claims 1, wherein the movements of the tampon pad in relation to the detail involve the changing of at least one angle of attack in relation to the longitudinal axis.

4. The method of claim 1, wherein the friction and the movement of the tampon pad in the at least one the directions in relation to the electronic unit creates at least one swelling of the tampon pad.

5. The method of claim 4, wherein the movements in time and space of at least one of the tampon pad and the electronic unit are controlled by a computer.

6. The method of claim 1, wherein the form of the tampon pad is adapted to the form of one or more parts of the unit.

7. The method of claim 6, wherein the tampon pad is furnished with a slot adapted to the form of at least one protruding part of the unit.

8. The method of claim 1, wherein at least one of the tampon pad and the unit move.

9. The method of claim 1, wherein the movement is made stepwise.

10. The method of claim 1, wherein the movement is made continuously.

11. The method of claim 1, it wherein the movement involves accelerations and retardations.

12. The method of claim 1, wherein the movement is made between the tampon pad and a cliché to pick up the conductive coating.

13. The method of claim 1, wherein moving the tampon pad in small movements in relation to the electronic unit causes a rubbing of at least the portion of the tampon pad to occur against the surface of the electronic unit.

14. The method of claim 1, comprising:
   moving the tampon pad in small movements in the direction along the longitudinal axis while moving the tampon pad in small movements in at least one of the direction substantially parallel to the surface of the electronic unit and the rotational direction about the longitudinal axis while at least the portion of the tampon pad is substantially in contact with the surface to be printed.

* * * * *